US011295657B2

(12) United States Patent
Zhang et al.

(10) Patent No.: US 11,295,657 B2
(45) Date of Patent: Apr. 5, 2022

(54) METHOD AND SYSTEM FOR SWITCHED DISPLAY OF GRAYSCALE OF MULTI-LINE SCAN LED (71) Applicant: PURESEMI Co., Ltd., Nanjing (CN)

(72) Inventors: Ruoping Zhang, Nanjing (CN); Xiao Song, Nanjing (CN); Zhaoyu Jiang, Nanjing (CN); Shuzhuan He, Nanjing (CN)

(73) Assignee: PURESEMI CO., LTD., Nanjing (CN)

( * ) Notice: Subject to any disclaimer, the term of this patent is extended or adjusted under 35 U.S.C. 154(b) by 0 days.

(21) Appl. No.: 17/252,194

(22) PCT Filed: Mar. 31, 2020

(86) PCT No.: PCT/CN2020/082229
§ 371 (c)(1),
(2) Date: Dec. 14, 2020

(87) PCT Pub. No.: WO2021/147170
PCT Pub. Date: Jul. 29, 2021

(65) Prior Publication Data
US 2021/0407367 A1 Dec. 30, 2021

(30) Foreign Application Priority Data
Jan. 22, 2020 (CN) .......................... 202010074883.6

(51) Int. Cl.
G09G 3/3233 (2016.01)
G09G 3/20 (2006.01)
(Continued)

(52) U.S. Cl.
CPC ............. *G09G 3/2007* (2013.01); *G09G 3/32* (2013.01); *G09G 2310/0286* (2013.01);
(Continued)

(58) Field of Classification Search
CPC .. G09G 3/2018; G09G 3/2081; G09G 3/3291; G09G 2320/0285;
(Continued)

(56) References Cited

U.S. PATENT DOCUMENTS

2011/0074799 A1* 3/2011 Wu ....................... G09G 3/3216
345/532
2019/0279553 A1* 9/2019 Vahid Far ............ G09G 3/2022
2019/0311673 A1* 10/2019 Li ......................... G09G 3/3233

FOREIGN PATENT DOCUMENTS

CN 102054434 A 5/2011
CN 103345900 A 10/2013
(Continued)

Primary Examiner — Duc Q Dinh (57) ABSTRACT

The present disclosure discloses a method and system for switched display of a grayscale of a multi-line scan light-emitting diode (LED), and relates to the field of LED display technology. In view of the problems in the prior art that a multi-line scan constant-current source chip has an insufficient refresh rate, a low grayscale level, and a poor low-grayscale effect, the present disclosure provides a method during the display of relatively high grayscales, a display cycle is scrambled. During the display of relatively low grayscales, the grayscales are combined. In the present disclosure, a relatively high refresh rate and a grayscale level can still be ensured in a case of a relatively large quantity of line scans. In addition, in the case of low-grayscale display, the problems such as low-grayscale speckles, slightly dark low-grayscale, and relatively poor low-grayscale linearity are resolved, thereby improving a picture display effect.

15 Claims, 9 Drawing Sheets (51) Int. Cl.
  *G09G 3/32*         (2016.01)
  *G11C 11/419*       (2006.01)
(52) U.S. Cl.
  CPC ..... *G09G 2310/08* (2013.01); *G09G 2360/12* (2013.01); *G11C 11/419* (2013.01)
(58) Field of Classification Search
  CPC ... G09G 2320/0257; G09G 2320/0242; G09G 2320/045; G09G 2330/021; G09G 3/2007; G09G 3/32; G09G 2310/0286; G09G 2310/08; G09G 2360/12; G09G 2310/062; G09G 2320/0233; G09G 2320/0247; G09G 2320/0626; G09G 3/3406; G09G 3/30; G09G 2310/02; G09G 3/3233; G09G 10/08; G09G 3/3611; G09G 3/3266; G09G 3/3674; G09G 2320/043; G09G 2360/14; G11C 11/419
  See application file for complete search history.

(56)      References Cited

FOREIGN PATENT DOCUMENTS

| CN | 103996375 A  | 8/2014  |
| CN | 106157892 A  | 11/2016 |
| CN | 109147653 A  | 1/2019  |
| JP | 2004118084 A | 4/2004  |

\* cited by examiner

METHOD AND SYSTEM FOR SWITCHED DISPLAY OF GRAYSCALE OF MULTI-LINE SCAN LED

BACKGROUND

Technical Field

The present application relates to the field of light-emitting diode (LED) display technology, and more specifically, to a method and system for switched display of a grayscale of a multi-line scan LED.

Related Art

As a new type of lighting material, an LED has the advantages such as a long service life, low power consumption, a small size, and safety and reliability. At present, LEDs have been widely used in lighting devices, display screens, and other devices. With the development of narrow pixel pitch LED technology and grayscale modulation technology, an LED display screen can already display more delicate and realistic images and pictures currently. In a narrow pixel pitch LED display screen, a relatively large quantity of LEDs are placed on a relatively small light board. To improve the use efficiency of a chip and reduce the costs of building a screen, a multi-line scan constant-current source chip is generally used for controlling each LED. Therefore, a display algorithm of driving the chip plays a key role in whether the LED display screen can produce high-quality images.

There are two methods for controlling a grayscale of an LED display screen. One method is to change a flowing current. An LED generally allows a continuous operating current of about 20 mA. Except for a saturation phenomenon in a red LED, the grayscales of other LEDs are basically proportional to the flowing current. In the other method, a pulse width modulation method is used to control a grayscale by using the persistence of vision of human eyes. That is, the pulse width of light is periodically changed. The jitter of light-emitting pixels is imperceptible to human eyes provided that the cycles of repeated lighting are short enough.

In a grayscale modulation algorithm, two algorithms are usually used. One algorithm is a common built-in pulse-width modulation (PWM) algorithm. That is, the light/dark time of an LED is joined for display to implement display effects under different grayscales. However, the method has a major deficiency, that is, an excessively low display refresh rate. Because a time interval between two adjacent light emission cycles is relatively long. If a frame frequency is relatively low, a flickering phenomenon easily perceptible to human eyes may occur. The other method is a scrambled-PWM (SPWM) algorithm. That is, a conduction time of a group of data is scrambled into several time cycles to increase an overall refresh rate of the LED display screen. Although the method improves the deficiency of the low refresh rate of the built-in PWM algorithm, the conduction time of the original lighting under low grayscales is very short. If the grayscales are then scrambled, a single grayscale value in each group of cycles is highly prone to incomplete display, resulting in low-grayscale speckles, slightly dark low-grayscales, and relatively poor low-grayscale linearity. The phenomenon is especially obvious when a display clock of grayscales has a high frequency.

SUMMARY

1. Technical Problems to be Resolved

In view of the problems in the prior art that a multi-line scan constant-current source chip has an insufficient refresh rate, a low grayscale level, and a poor low-grayscale effect, the present application provides a method and system for switched display of a grayscale of a multi-line scan LED, so that a relatively high refresh rate and a grayscale level can still be ensured in a case of a large quantity of line scans. In addition, in the case of low-grayscale display, the problems such as low-grayscale speckles, slightly dark low-grayscale, and relatively poor low-grayscale linearity can be resolved, thereby greatly improving a picture display effect.

2. Technical Solution

The objective of the present application is achieved by using the following technical solutions.

A method for switched display of a grayscale of a multi-line scan LED includes the following steps:

step 1: obtaining a grayscale level and grayscale data of an LED, the grayscale data K being a binary value corresponding to the grayscale level;

step 2: setting a compensation level, adding a compensation value to the grayscale data K according to the compensation level, to obtain grayscale data K', so that a brightness loss caused by a response time of a physical circuit is offset by a compensation value;

step 3: dividing the compensated grayscale data K' into most significant bit data $K_{MSB}$ and least significant bit data $K_{LSB}$ according to a refresh factor of the LED, a bit width N of the least significant bit data $K_{LSB}$ being used for dividing a complete display clock cycle into $2^N$ groups for display, a bit width M of the most significant bit data $K_{MSB}$ representing that there are $2^M$ sub-clock cycles in each group of clock cycles obtained through division;

step 4: setting a combination level Q, and determining whether the combination level Q is 0 or whether $2^Q$ is not greater than most significant bit data $K_{MSB}$, and if yes, performing scrambled display of the grayscale data K', otherwise performing combined display of the grayscale data K', thus achieving switched display of the grayscale data; and step 5: repeating step 1 to step 4 R*C times according to a line quantity R and a channel quantity C of display of an LED constant-current driver chip, to form a complete display output.

Further, in step 2, if the grayscale data K' exceeds a maximum grayscale value, the grayscale data K' is equal to the maximum grayscale value to avoid a data overflow.

Further, the dividing the grayscale data K' in step 3 includes the following steps:

obtaining the refresh factor and a frame frequency of the LED;

multiplying the refresh factor by an original refresh rate, to obtain a target refresh rate;

dividing the target refresh rate by the frame frequency, to obtain a bit width N of the least significant bit data; and subtracting the bit width N of the least significant bit data from the grayscale level, to obtain a bit width M of the most significant bit data.

Further, the performing scrambled display of the grayscale data K' in step 4 includes the following steps:

displaying the most significant bit data $K_{MSB}$ in $2^N$ groups respectively, and performing scrambled display of most significant bit data; and distributing the remaining least significant bit data $K_{LSB}$ to the $2^N$ groups according to a dichotomy for display, and distributing the remaining least significant bit data evenly into groups obtained through division.

Further, the performing combined display of the grayscale data K' in step 4 includes the following steps:

dividing the grayscale data K' by $2^N$ to obtain an integer part and a remainder part;

distributing the integer part to the $2^N$ groups according to a dichotomy for display, the quantity of groups represented by the integer part being a part displayed in the $2^N$ groups; and distributing the remainder part to a sub-cycle of a first group for display, and distributing an extra lighting time to the first group for display.

Further, the distributing the remaining least significant bit data $K_{LSB}$ to the $2^N$ groups according to a dichotomy for display includes the following steps:

generating an N-bit counter CNT, to record a quantity of groups obtained through division; and determining whether CNT[0:N-1] is less than the least significant bit data $K_{LSB}$, where if yes, a pulse-width modulation (PWM) pulse with an extra lighting time is displayed in the group, or otherwise a PWM pulse with an extra lighting time is not displayed in the group.

Further, the distributing the integer part to the $2^N$ groups according to a dichotomy for display includes the following steps:

generating an N-bit counter CNT, to record a quantity of groups obtained through division; and determining whether CNT[0:N-1] is less than the value of the integer part of the grayscale data K', where if yes, a PWM pulse with $2^Q$ units of time is displayed in the group, or otherwise a PWM pulse does not need to be displayed in the group.

Further, the generating an N-bit counter CNT, to record a quantity of groups obtained through division includes the following steps:

recording, by the counter CNT, the quantity of groups obtained through division; and interchanging the most and least significant bits of the counter CNT, to generate a new quantity of groups of a dichotomy, the new quantity of groups of the dichotomy being used for comparing the least significant bit data $K_{LSB}$ and the value of the integer part of the grayscale data K'.

A system for switched display of a grayscale of a multi-line scan LED is configured to perform the foregoing method, to complete the display of all grayscale data.

Further, a system for switched display of a grayscale of a multi-line scan LED includes:

a shift register, receiving grayscale data inputted from outside, and storing the grayscale data in a static random access memory (SRAM);

the SRAM, receiving and storing the grayscale data, and sending the grayscale data to a data processing module;

the data processing module, receiving the grayscale data, processing the data, and sending the processed data to a comparator;

a counter, recording a quantity of clocks of grouped data, and sending the quantity of clocks to the comparator; and the comparator, receiving the data in the data processing module and the counter, comparing the data, and outputting a PWM pulse.

3. Beneficial Effects

Compared with the prior art, the present invention has the following advantages.

The present application provides an SC-PWM algorithm. In the method, a display cycle is scrambled to display relatively high grayscales, to improve an overall display refresh rate, and the principle of a dichotomous distribution is used to distribute lighting cycles as evenly as possible to all frames of a picture, so that a displayed image is more delicate and clearer. However, when relatively low grayscales are displayed, the grayscales are combined to resolve the problems such as low-grayscale speckles, slight darkness, and poor linearity, so that a relatively high grayscale level can still be ensured in a case of a relatively large quantity of line scans. The present application further provides a low-grayscale compensation method. The method is used for compensating for a grayscale loss caused by a response time of an analog circuit, so that an actual display grayscale may be closer to a theoretical value, and a low-grayscale display effect is greatly improved by using the SC-PWM algorithm in combination.

DETAILED DESCRIPTION

For a multi-line scan constant-current source chip commonly used in an LED, the chip can support as many line scans as possible, thereby saving power. However, once a quantity of line scans increases, a unit lighting conduction time is less than 10 ns. Because an analog circuit requires a response time, it is very likely that an actual lighting conduction time is much shorter than a theoretical time, causing various display problems such as slight darkness under low grayscales, speckles, and poor linearity. For commercially available products, if the quantity of line scans reaches 64, the unit lighting conduction time needs to be relatively long to ensure a better low-grayscale effect. In this case, there can be only 12- or 13-bit grayscale level, and a refresh rate cannot be very high. Eventually, the types and gradients of displayed colors are very restricted, picture quality is relatively poor, and a display effect is affected.

A method and system for switched display of a grayscale of a multi-line scan LED are provided by the present application, and may be applied to an HX80XX series chip. In the present application, PWM may be scrambled and combined according to obtained grayscale data, an obtained grayscale level, an obtained combination level, an obtained refresh factor, and an obtained compensation level. A relatively high refresh rate and grayscale level can still be ensured in a case of a large quantity of line scans. In addition, in the case of low-grayscale display, the problems such as low-grayscale speckles, slightly dark low-grayscale, and relatively poor low-grayscale linearity can be resolved, thereby greatly improving a picture display effect.

The present application is described in detail below with reference to the accompanying drawings and specific embodiments.

Figure 1:
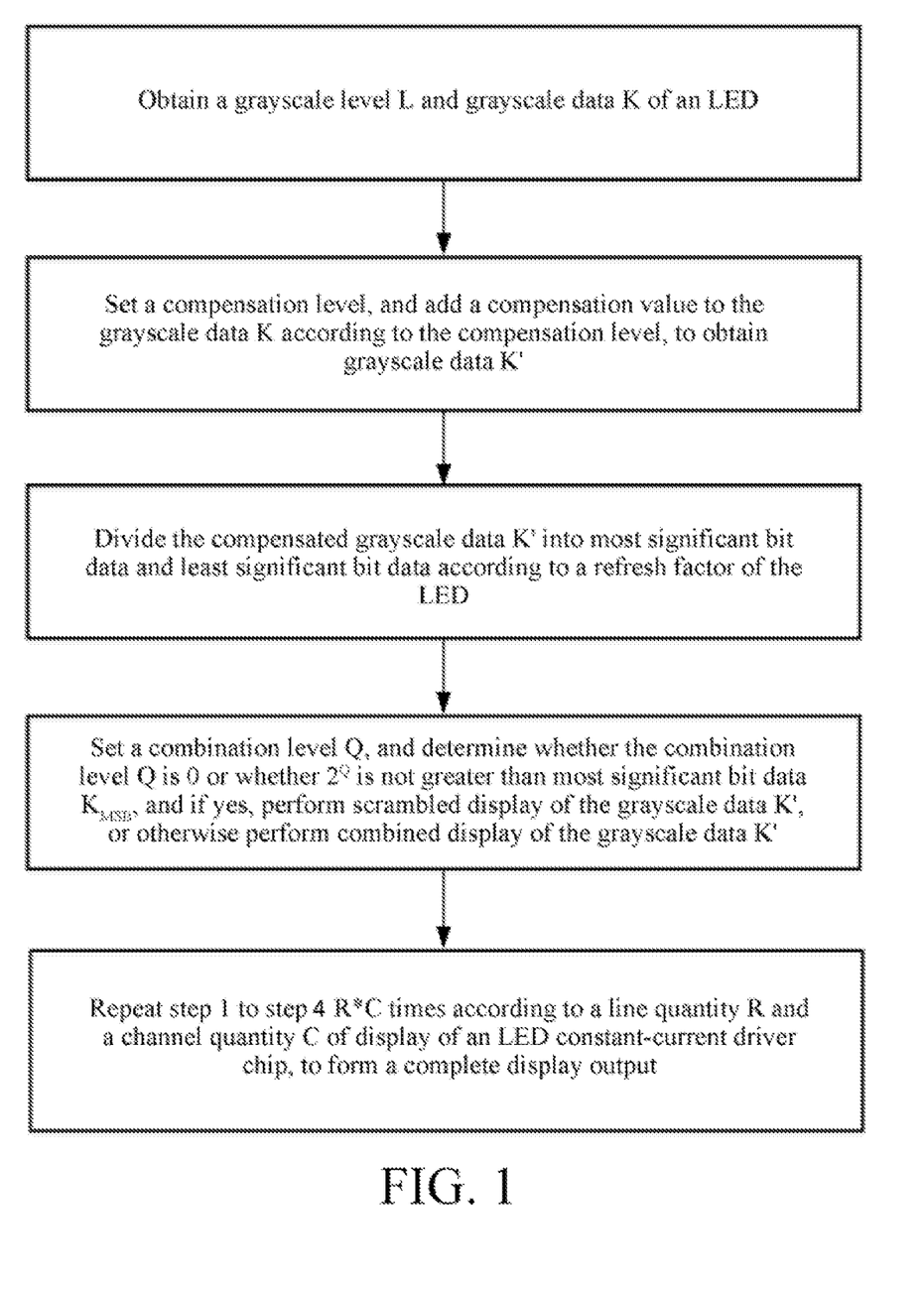
FIG. 1 is a schematic flowchart of a method according to the present application.

As shown in FIG. 1, the present invention mainly includes the following steps.

Step 1: Obtain a grayscale level and grayscale data of an LED. A quantity of bits of the grayscale level is L. A value corresponding to the grayscale data is K. The grayscale level is a quantity of changes that an LED screen has from the darkest state to the brightest state, and represents a bit width of the grayscale data. The grayscale data K is a binary value corresponding to the grayscale level, is any specific value included in the range of the grayscale level, and represents a determined brightness. A larger value indicates a higher brightness. If the grayscale level has L bits, the LED screen has $2^L$ color changes. The grayscale data is a specific value within a range of 0 to $2^L$, the grayscale data $\{D_{L-1}, D_{L-2}, \ldots, D_1, D_0\}$ is sent to a chip by a transmission card, and the range of the displayed grayscale data is from 0 to $2^L-1$.

Step 2: Set a compensation level S, compensate the grayscale data K according to the compensation level S, and convert the grayscale data K into grayscale data K'. The compensation is to add a compensation value to the grayscale data K, to obtain a binary number K' whose bit width is still L, and the compensation value of the compensation is determined by the compensation level.

The compensation level in the compensation is an adjusted parameter. The value of the compensation level is set by a display time of a single grayscale. A cycle of the display time is determined by a control panel of the LED screen. Therefore, a lost time under various cycles may be simulated according to a software, and an appropriate value may be preset according to an actual selected display time cycle. For example, 0, 1, 2, . . . , and S are set, thereby greatly improving the flexibility and operability of the system. When the external inputted grayscale data K is relatively large, the grayscale value K added with the compensated grayscale value has exceeded a maximum grayscale value. The compensated grayscale data K' remains unchanged at the maximum grayscale value, to avoid a data overflow. The maximum grayscale value is the maximum grayscale data at a grayscale level. For example, the grayscale data corresponding to the 14-bit grayscale level varies from 0 to 16383, and the maximum grayscale value is 16383. The grayscale level is set manually. If the grayscale level is set excessively high but a displayed algorithm is not appropriately set, that is, a single solution is used to display the grayscale data, for example, a scrambling algorithm or a combination algorithm is used globally, a poor display effect occurs in some conditions. For example, the single scrambling algorithm leads to a poor display effect due to insufficient brightness in a low-grayscale condition, and a low refresh rate of the combination algorithm in the medium- and high-grayscale conditions leads to insufficient delicacy of a picture.

Figure 2:
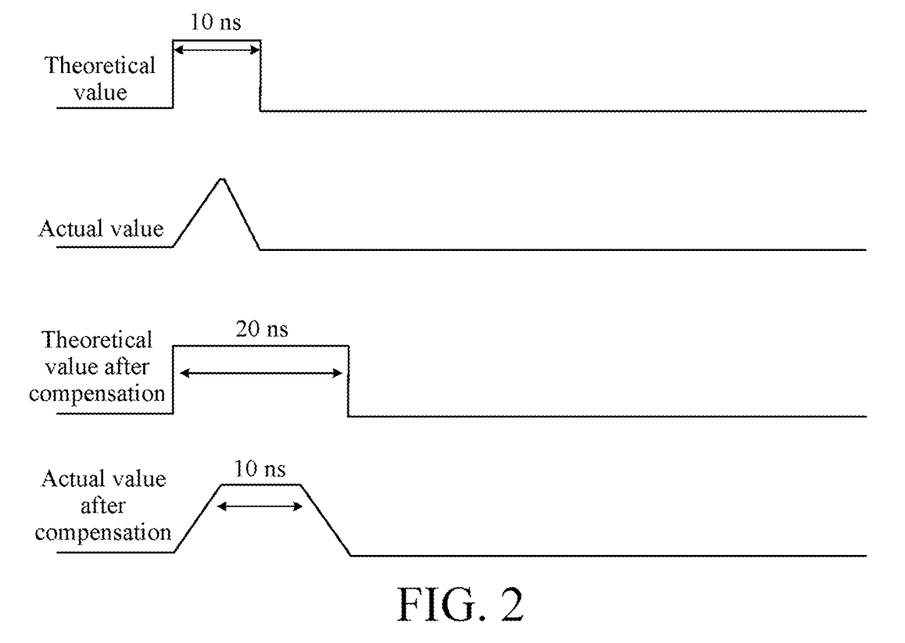
FIG. 2 is a schematic diagram of low-grayscale compensation according to the present application.

As shown in FIG. 2, when the quantity of line scans is large and the grayscale level is relatively high, the display time under low grayscales is very short. When the grayscale is 1, if the display time of the grayscale is 10 ns in an ideal condition but switching of an actual analog circuit requires a particular response time, an actual lighting time is very likely to be far shorter than a theoretical value, resulting in problems such as low-grayscale speckles, slight darkness under low-grayscale speckles, and relatively poor low-grayscale linearity. Therefore, after obtaining the grayscale level and the grayscale data of the LED, the grayscale data K needs to be compensated, and the compensation of the grayscale value is actually to compensate a PWM pulse brightness lost in the response time of the analog circuit. For example, the grayscale data K is 1, the grayscale data K is compensated with a grayscale value of 1, and the grayscale data K is converted into grayscale data K' with the value of 2. In this way, a brightness loss caused by a response time of a physical circuit is offset by an increased compensation value, so that a theoretical grayscale value may be displayed in practice, thereby greatly improving the display effect under low grayscales.

Step 3: Divide the compensated grayscale data K' into most significant bit data and least significant bit data according to a refresh factor of the LED, a bit width N of the least significant bit data being used for dividing a complete display clock cycle into $2^N$ groups for display, a bit width M of the most significant bit data representing that there are $2^M$ sub-clock cycles in each group of clock cycles obtained through division. For example, the display clock cycle of the grayscale data K' is $2^L$, the $2^L$ display clock cycles are divided into the $2^N$ groups for display. Each group has $2^M$ clock cycles. M+N=L, and M and N are both positive integers. The time of the display clock is a unit display time, that is, a display time of a grayscale. The display clock cycle corresponds to the grayscale data. For example, the grayscale level is 14 bits, and the total display cycle is the fixed 16384 clock cycles. If the grayscale data is 80, lighting is performed in 80 clock cycles, and extinguishing is performed in 16304 clock cycles. If the grayscale data is 8000, lighting is performed in 8000 clock cycles, and extinguishing is performed in 8384 clock cycles. The refresh factor represents a refresh multiple that can be further increased based on a basic refresh rate. A target refresh rate is a display refresh rate to be obtained, has a unit of Hertz (Hz), and is defined as a quantity of times that the picture changes per second. For example, the refresh rate is 1920 Hz, representing that the picture changes 1920 times per second. The refresh factor is a multiple based on a minimum refresh rate, and the unit is a multiple. For example, the minimum refresh rate that can be displayed by a designed chip is 960 Hz, the refresh rate of 960 Hz is referred to as a refresh factor 1, the refresh rate of 1920 Hz is referred to as a refresh factor 2, the refresh rate of 3840 Hz is referred to as a refresh factor 4, the refresh rates of 1920 Hz and 3840 Hz are target refresh rates, and the target refresh rates are determined by the refresh factor and the basic refresh rate. A quantity of bits of the foregoing least significant bit data or most significant bit data is a bit width. Regardless of the value of the least significant bit data or the most significant bit data, the data is scrambled into a quantity of groups corresponding to the bit width of the least significant bit data. However, the value of the least significant bit data represents that several groups can obtain an extra unit of time for lighting. The least significant bit data is not considered in a combination mode, and distribution is performed according to the integer and the remainder.

The division of the most significant bit data and the least significant bit data is used for increasing the refresh rate of the LED. When a quantity of bits of the least significant bit data is larger, a quantity of groups in the display clock cycle is larger, and the refresh rate of the LED is higher. For example, a picture of the LED has 60 frames per second. If 15-bit grayscale data is not displayed in groups, the display refresh rate is 60*1=60 Hz. If 10-bit most significant bit data and 5-bit least significant bit data are obtained through division, that is, the 15-bit grayscale data is divided into $2^5$ groups for display, the display refresh rate is 60*32=1920 Hz, the display refresh rate is greatly improved, and the quality of an image displayed by the LED is relatively high. Therefore, a form of M+N is obtained through division according to the display refresh rate required by the LED screen to meet a requirement of increasing the refresh rate.

The refresh factor is defined as P herein, the refresh factor may be set to $2^0, 2^1, \ldots, 2^P$ times the original refresh rate. The grayscale data and the refresh rate are both binary numbers, so the refresh factor is a multiple of 2. The maximum quantity of sub-clock cycles in each group of the foregoing division is $2^J$, M=J-P, and P<J. The quantity of display clocks in each sub-clock cycle is $2^{J-P}$, and the quantity of groups of the sub-clock cycles is $2^N$ groups. The value of the bit width M of the most significant bit data and the bit width N of the least significant bit data are adjusted by adjusting the value of the refresh factor P, thereby implementing the change of the refresh rate.

Figure 3:
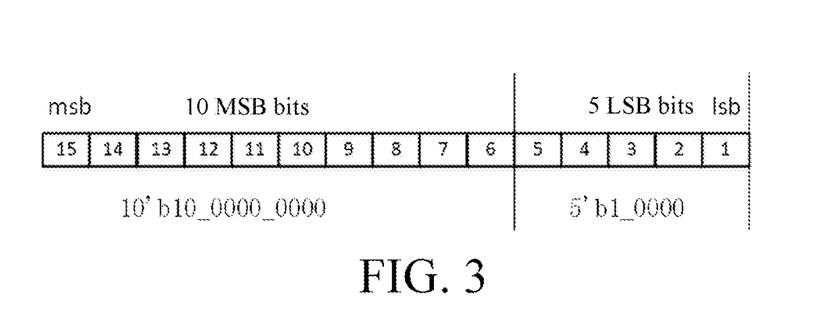
FIG. 3 is a schematic diagram of a scrambling principle according to the present application.
Figure 4:
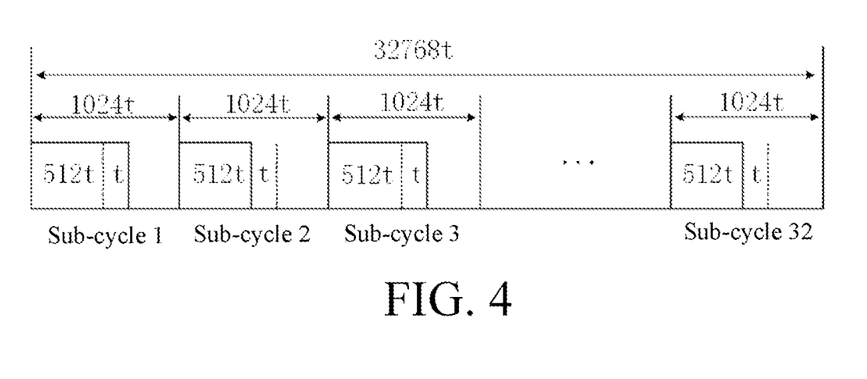
FIG. 4 is a schematic diagram of a scrambling principle according to the present application.

As shown in FIG. 3 and FIG. 4, the displayed grayscale data is 15 bits, and the grayscale value is 16400. According to an SC-PWM algorithm, the 15-bit grayscale data is first divided into the most significant bit data and the least significant bit data, for example, 10-bit most significant bit data and 5-bit least significant bit data. The bit width of the least significant bit data determines the quantity of scrambling sub-cycles, and the 5-bit least significant bit data scrambles the grayscale data into $2^5$ sub-cycles. The most significant bit data plays a leading role in the display, so the data in the most significant bit data is displayed repeatedly in each sub-cycle. The most significant bit data with the bit width of 10 is 10'b10_0000_0000, representing that 512 units of lighting, time are displayed first in the sub-cycle. The maximum value of the 10-bit most significant bit data is 1023, the binary is 10'b11_1111_1111, and the display time of each group is 1024. Therefore, the least significant bit data is distributed into the 32 groups of the sub-cycles, to determine the brightness and darkness of the last unit of time. If least significant bit data $K_{LSB}$ is 16 and the binary is 5'b1_0000, the least significant bit data is distributed to the 32 sub-groups according to the principle of a dichotomy. That is, 16 pieces of least significant bit data are sequentially distributed to the $1^{st}, 17^{th}, 9^{th}, 25^{th}, \ldots,$ and $31^{st}$ groups, and an extra lighting time is displayed in the distributed sub-cycles.

The extra lighting time is that there is a lighting time of one more clock in the cycle. For example, the grayscale data is 67 and is scrambled into 32 groups. According to the principle of scrambling and distribution, two grayscales are displayed in 29 groups, and three grayscales are displayed in three groups. The three groups are referred to as one extra lighting time, and the lighting time is the display time of grayscales.

The dividing the grayscale data in the SC-PWM algorithm in the present application may be changed according to a specific requirement. First, a set refresh factor and basic refresh rate are obtained, and are multiplied to obtain the target refresh rate. An appropriate quantity of scrambling groups is selected according to the target refresh rate, to determine a least significant bit width. The least significant bit width is then subtracted from a total bit width to obtain the most significant bit width. For example, the display refresh rate needs to be set to 3840 Hz, and a frame frequency needs to be 60 Hz. A calculation formula is the refresh rate=the frame frequency*the quantity of scrambling groups. The 3840/60=64 groups need to be obtained through scrambling. The least significant bit data is 6 bits, and the most significant bit data is the 15-bit grayscale data minus the 6-bit least significant bit data. The 15-bit grayscale data is divided into 9-bit most significant bit data and 6-bit least significant bit data. The robustness of the algorithm is improved by flexibly adjusting the division of the grayscale data.

Step 4: Set a combination level Q to determine whether the combination level Q is 0 or whether $2^Q$ is not greater than most significant bit data $K_{MSB}$, and if yes, perform scrambled display, where the most significant bit data $K_{MSB}$ is displayed respectively in the $2^N$ groups, that is, displayed in each sub-cycle obtained through division, and the remaining least significant bit data $K_{LSB}$ is distributed to the $2^N$ groups according to a dichotomy for display, or otherwise perform combined display, where the most significant bit data $K_{MSB}$ is not displayed in the $2^N$ groups, that is, not displayed in each sub-cycle obtained through division, the binary data K'[N+Q-1:Q] is distributed to the $2^N$ groups according to a dichotomy for display, and K' [Q-1:0] is distributed to a first sub-cycle for display. K' [N+Q-1:Q] represents an integer part obtained by dividing the grayscale data K' by $2^N$, K'[Q-1:0] represents a remainder part obtained by dividing the grayscale data K' by $2^N$. The integer part is the quantity of groups displayed in the $2^N$ groups, and the grayscale value displayed in each group is $2^Q$. The remainder part is the quantity of clock cycles that are displayed additionally in a first group. Although the combined display of the grayscale data is performed, a method of scrambled display is still used to perform grouping. For example, the 15-bit grayscale data is divided into the form of 10+5. The integer part that is calculated is 19. However, the data is divided into 32 groups. Data is displayed in only 19 groups of the 32 groups. No data is displayed in the remaining 13 groups.

In the dichotomous distribution, the quantity of groups obtained through division is counted by an N-bit counter CNT. During scrambled display, if CNT[0:N-1] is less than $K_{LSB}$, a PWM pulse with an extra lighting time needs to be displayed in the group, or otherwise, a PWM pulse with an extra lighting time does not need to be displayed in the group. CNT[0:N-1] represents the quantity of groups of the dichotomy and is used for implementing the dichotomous distribution. During combined display, if CNT[0:N-1] is less than the K'[N+Q-1:Q], a PWM pulse with $2^Q$ units of time are displayed in the group, or otherwise, a PWM pulse does not need to be displayed in the group. A PWM pulse with extra K'[Q:0] units of time are displayed in a scrambling cycle of another first group.

The combination level Q represents the minimum clock cycle displayed in each group after the total grayscale data is scrambled, and may be set to $2^0, 2^1, \ldots, 2^Q$ display clock cycles. A setting rule of the combination level is related to the displayed grayscale level. In this embodiment, when the grayscale level is 13 bits or fewer, the combination level is set to 0. When the grayscale level is 14 bits, the combination level is set to 1. When the grayscale level is 15 bits, the combination level is set to 2. When the grayscale level is 16 bits, the combination level is set to 3. If sub-grayscale data displayed in each group is less than a set value or the combination level is 0, the performing combined display of the sub-grayscale data, and the most significant bit data $K_{MSB}$ is not displayed. Otherwise, scrambled display is performed. That is, the most significant bit data $K_{MSB}$ is displayed respectively in each sub-cycle, and a PWM pulse with $K_{MSB}$ units of time is displayed in each sub-cycle. The sub-grayscale data is the grayscale data $K_{MSB}$ in the clock cycle of each group. When the sub-grayscale data is less than the set value, it indicates that the brightness of the screen is insufficient, and pictures may be unclear. Therefore, the brightness is increased through combined display. When the sub-grayscale data is greater than the set value, the brightness of the screen is sufficient. Therefore, scrambled display is performed, and the display refresh rate of the screen is increased, thereby improving the smoothness of pictures. For example, the combination level Q is set to 1. When the most significant bit data is not less than $2^1$, scrambled display is performed. When the most significant bit data is less than $2^1$, combined display is performed. Assuming that the grayscale data with the bit width of 15 is grouped according to a 10+5 grouping mechanism, when the 15-bit data is relatively small, the most significant bit data is less than 2, and it is considered that the data is a small grayscale value. Therefore, a method of combined display is used. When the 15-bit data is relatively large, the most significant bit data is greater than 2. It is considered that the data is a large grayscale value. Therefore, a method of scrambled display is used.

Figure 5:
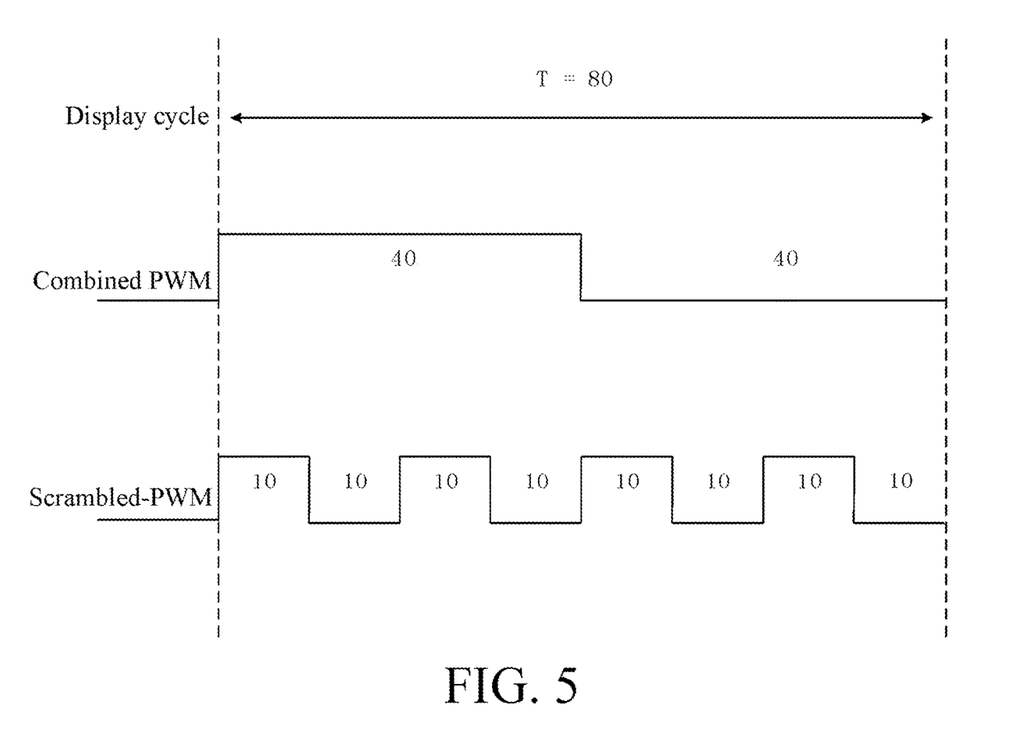
FIG. 5 is a schematic diagram of comparison between combined PWM and scrambled PWM according to the present application.

As shown in FIG. 5, for example, the display total cycle is 80 units of time, and a display grayscale is 40. In combined PWM display, all 40 units of lighting time are joined for display, followed by 40 units of extinguishing time. However, in scrambled PWM display, the total of 40 units of lighting time is divided into four groups for display. The display of every 10 units of lighting time is followed by extinguishing of 10 units of time. In this case, the original display in one cycle becomes the display in four smaller cycles, so that the refresh rate is increased to four times. Therefore, a method of scrambled PWM can increase the refresh rate of the LED display screen without affecting the grayscale.

Figure 6:
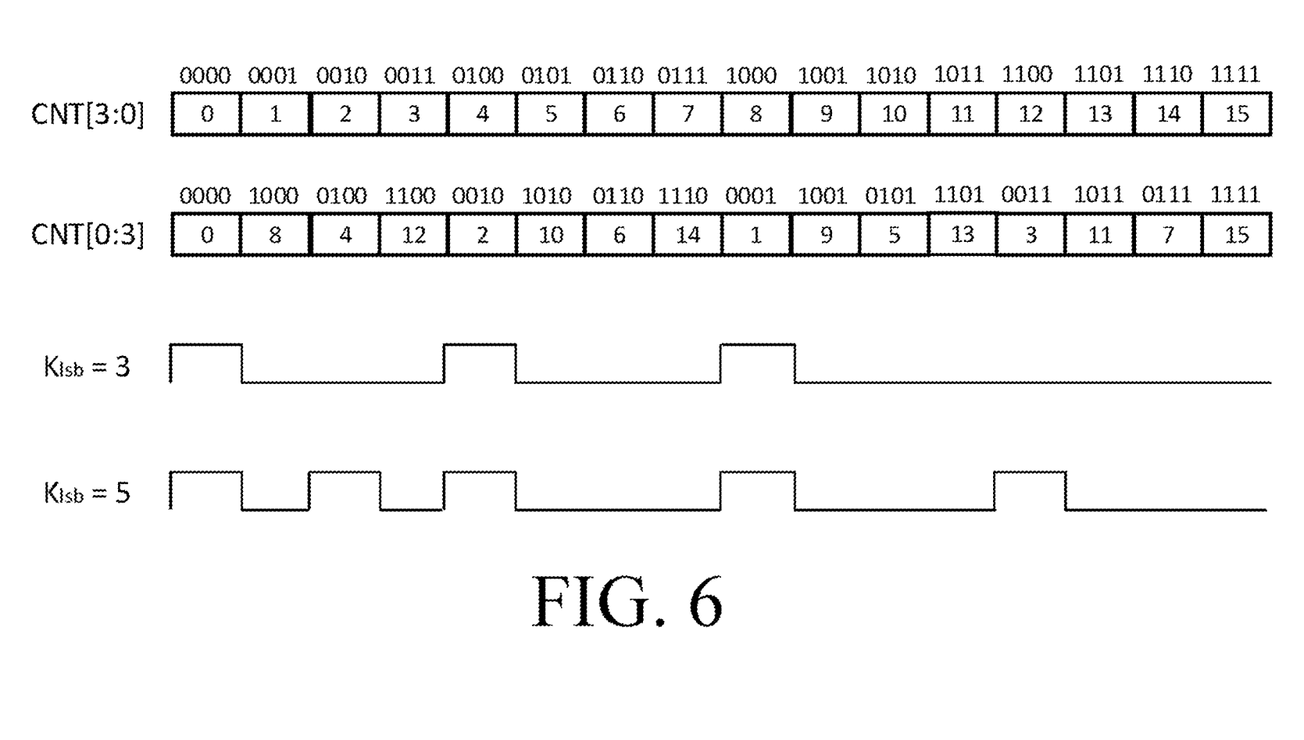
FIG. 6 is a schematic diagram of the principle of a dichotomous distribution according to the present application.

As shown in FIG. 6, in the solution, the grayscale data is divided into 16 groups, and a 4-bit counter may be used for counting. A counting range is from 4'b0000 to 4'b1111, that is, 0 to 15 of the decimal system, and is represented by CNT[3:0]. CNT[0:3] is obtained by interchanging the most and least significant bits of CNT[3:0], to generate a new group that is referred to as a quantity of groups of the dichotomy. When a sequence number of the quantity of groups of the dichotomy is less than $K_{LSB}$, a number may be distributed to the group, to implement the dichotomous distribution that the least significant bit data $K_{LSB}$ is 3 and 5.

Figure 7:
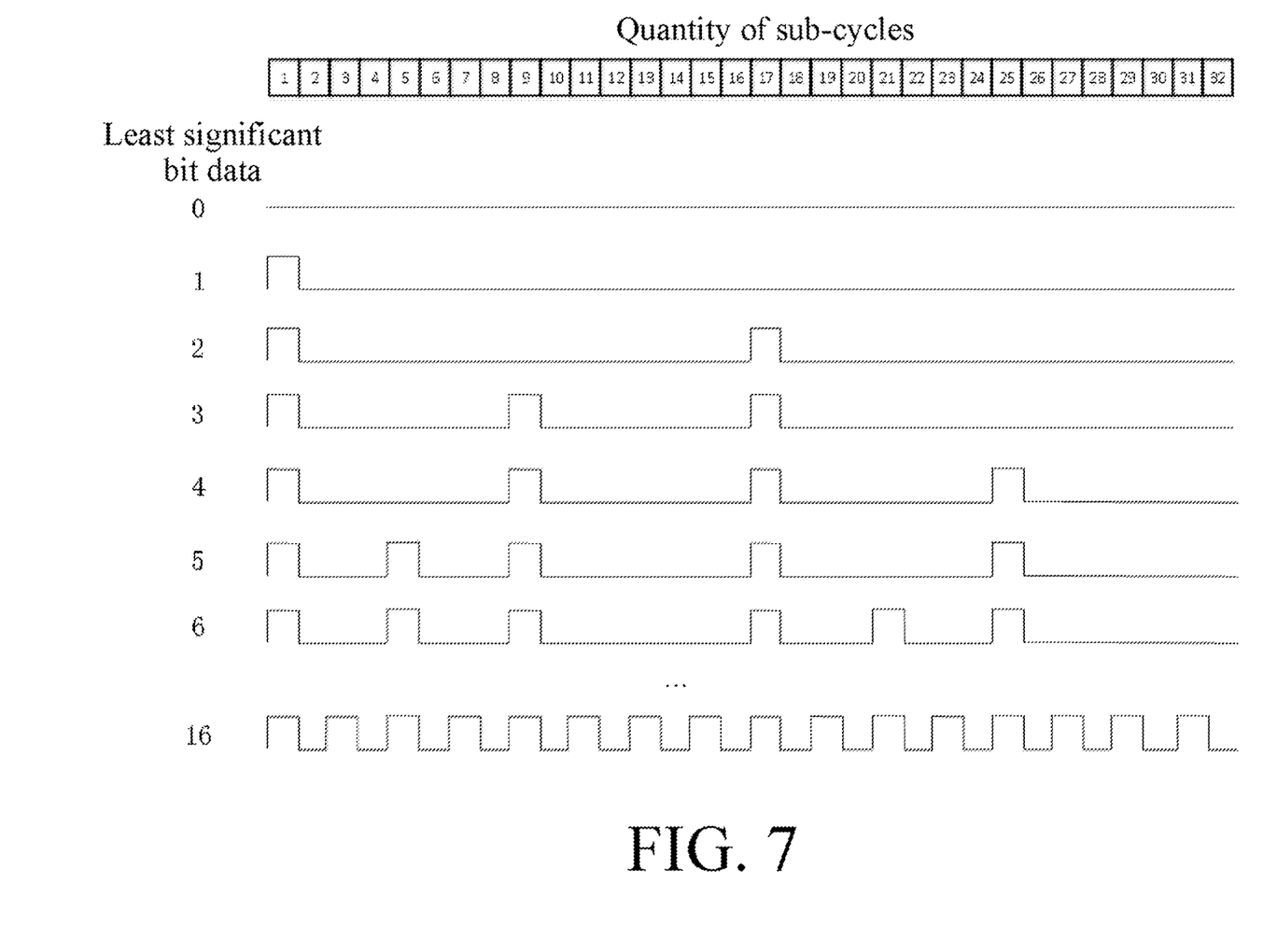
FIG. 7 is a schematic diagram of least significant bit data from dichotomous distribution according to the present application.

As shown in FIG. 7, the dichotomous distribution method implements an as even as possible lighting cycle of the LED screen, and is very friendly to the visual effect for human eyes. In this case, the total display time is still 1024t*32=32768t. Under a premise that the total lighting time remains unchanged, the refresh rate is increased by 32 times. The change of the display refresh rate may be implemented by changing the refresh factor to change the quantity of sub-cycles that is obtained through scrambling.

For example, the bit width of the grayscale data is 15, the combination level Q is set to 2, K'=15'b000_0000_0100_0001 that is, 65 in the decimal system. According to the grouping rule of M=10 and N=5, 10-bit most significant bit data is 10'b00_0000_0010, that is, 2 in the decimal system, and 5-bit least significant bit data is 5'b0_0001, that is, 1 in the decimal system. According to a determination mechanism, the value of the most significant bit data $K_{MSB}$ is 2 and is less than the combination level $2^2$, thus being displayed by merging, and each displayed group has four units of grayscale. 65/4=16, and the remainder is 1. The integer part is K'[N+Q-1:Q], that is, K'[5+2-1:2]=K'[6:2], and is a standard definition of a bit width in a digital circuit. K'[0] represents the first bit of the 15-bit data K', K'[6:2] represents the seventh bit to the third bit of K', and is 5'b10000, that is, 16 in the decimal system. The remainder part is K'[Q-1:0], that is, K'[2-1:0]=K'[1:0], and is 2'b01, that is, 1 in the decimal system. Therefore, the integer part 16 is distributed to 32 groups according to the dichotomy. Four units of grayscale are displayed in each group. The remainder 1 is distributed to the sub-cycle of the first group for display. That is, 4+1=5 units of grayscale are displayed in the first sub-cycle, and the total grayscale is 4*16+1=65 and remains unchanged.

Figure 8:
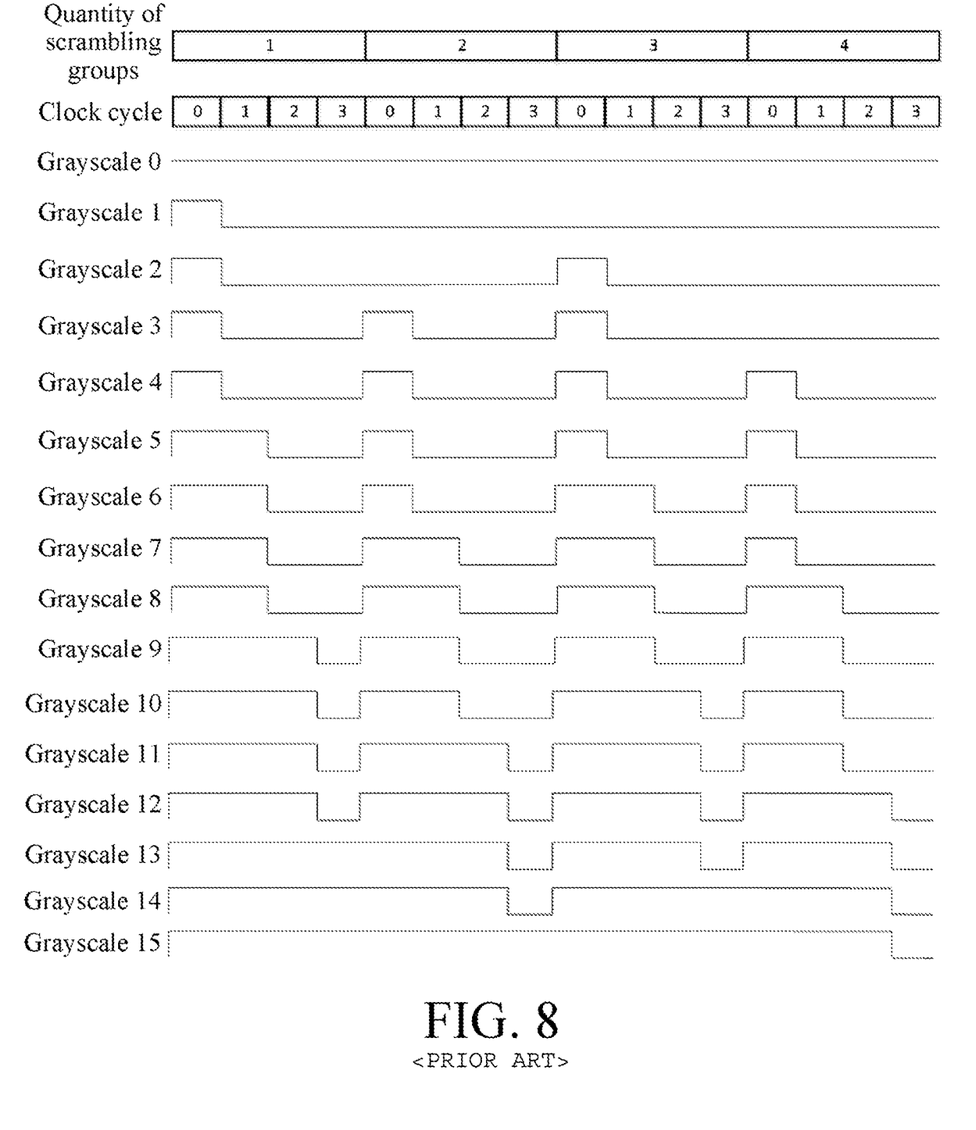
FIG. 8 is a schematic diagram of non-combined display of low grayscales in a conventional scrambling algorithm.

In a conventional PWM algorithm shown in FIG. 8, the 4-bit grayscale data is used as an example. The grayscale data is scrambled into four groups, and four pieces of grayscale data are distributed in each group. In the conventional PWM algorithm, the grayscale data is evenly distributed into each group in sequence. In this scrambling mechanism, the lighting time of each sub-cycle is very short in case that the grayscale value is relatively small. Because the analog circuit cannot quickly respond to a change of a digital signal. In addition, there may be differences between channels of each chip or between different chips, speckles or slight darkness may occur on the LED display screen. In a low-grayscale combination mechanism in the present application, the display under low grayscales can be enhanced, the minimum grayscale value of each sub-cycle that is scrambled is set to $2^Q$. When the grayscale value is less than $2^Q$ multiplied by the quantity of scrambling groups, the method of combined display is used. Otherwise, the method of scrambled display is used.

Figure 9:
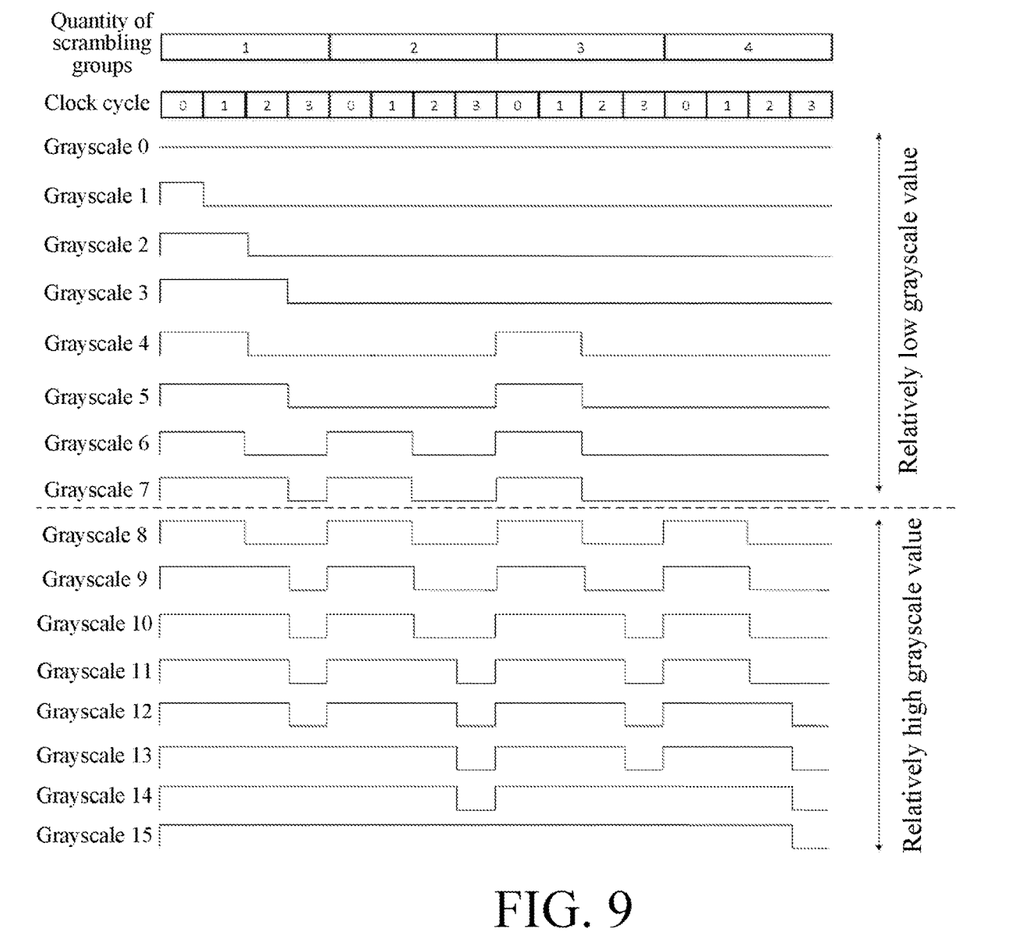
FIG. 9 is a schematic diagram of combined display of low grayscales according to the present application.

As shown in FIG. 9, the combination level Q is set to 1. That is, the lighting time in each scrambling sub-cycle needs to be not less than $2^1$. Except that the grayscale data is 1, the quantity of scrambling groups is 4. When the grayscale value is less than 2*4, the method of combined display is used, so that the opening time of the channel may be increased by joined display, the problems such as low-grayscale speckles or slightly darkness caused by excessively short pulse widths can be effectively alleviated, and the change of each grayscale value can be seen clearly. If the foregoing low-grayscale compensation function is used in combination, the display effect can further be improved, to adapt to different quantities of line scans, grayscale levels, and the like. However, as the grayscale value increases, the lighting time in each sub-cycle is already relatively long, and the relatively high refresh rate can be provided by perform scrambling to generate more groups.

Step 5: Repeat the foregoing steps R*C times according to a line quantity R and a channel quantity C of display of a single LED constant-current driver chip, to form a complete display output, where R and C are positive integers. The quantity of channels is a quantity of pixels driven by a chip. For example, an LED driver chip has 16 channels. Each time a line is changed, 16 pixels in each line are change together. For a multi-channel, multi-line scan LED constant-current driver chip, after sub-cycle data of each line is displayed, a line chip performs a line-change display operation, and channels do not interfere with each other and perform display simultaneously until all data has been displayed.

Figure 10:
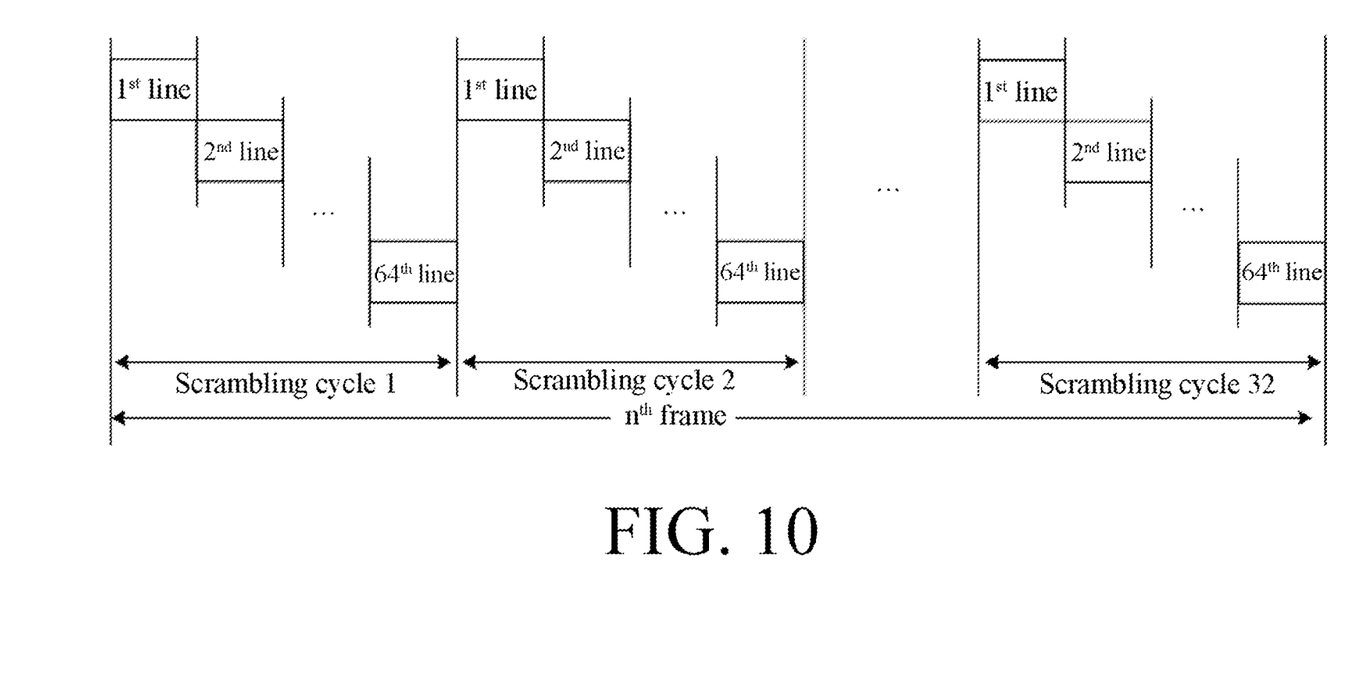
FIG. 10 is a schematic diagram of multi-line scan display according to the present application.

As shown in FIG. 10, 64 line scans and scrambling into 32 are used as an example. In each scrambling sub-cycle, display in a sub-cycle in each line is performed in sequence from the $1^{st}$ to $64^{th}$ lines, and a line scan display in a next sub-cycle is performed. When the last line of data in the last sub-cycle is displayed, and data of one frame is fully displayed.

Figure 11:
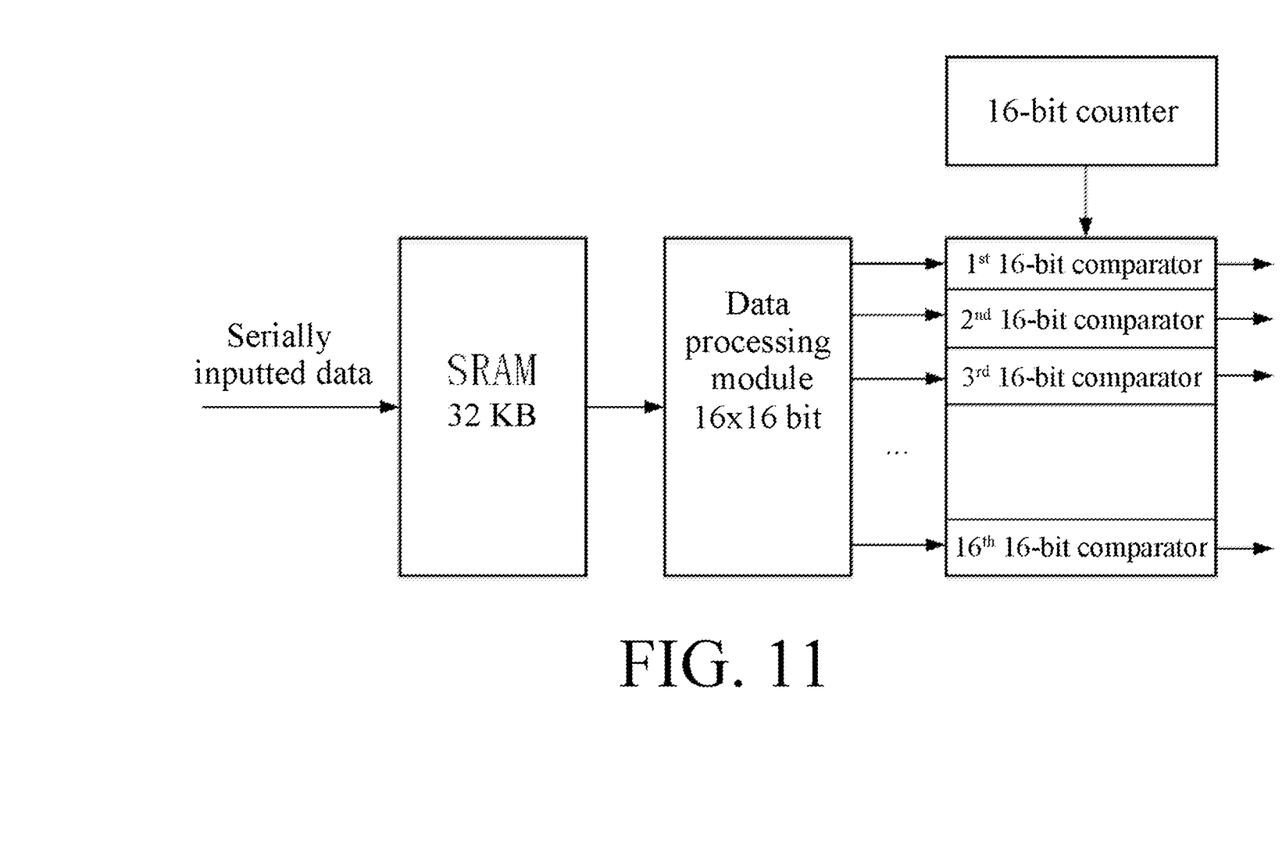
FIG. 11 is a schematic diagram of a constant-current LED display module according to the present application.

As shown in FIG. 11, if each piece of outputted data is the bit width of 16 bits, all grayscale display data of 64 line scans and 16 channels that are serially inputted from outside is stored in a SRAM by using a shift register, and all data required for the 16 channels is retrieved from the SRAM each time during a line scan of a line. There are a total of 16×16 bits. Data processing by an SC-PWM algorithm of a data processing module is performed on the 16 groups of data. A 16-bit counter is used for recording a currently displayed quantity of clock cycles. A data value processed by the data processing module is compared with the data in the counter by using a 16-channel 16-bit comparator. The PWM pulse with each channel is outputted. The counter records the currently displayed quantity of clock cycles. The grayscale data value represents the time of the clock cycles that require lighting, so that the quantity of clocks of the counter needs to be compared with the grayscale data. When the value of the counter is less than the grayscale data, the display is not completed and is continued. When the value of the counter is greater than the grayscale data, it represents that the display is completed and is no longer performed. The channels do not interfere with each other and perform display simultaneously until all data has been displayed.

Although the present application and implementations thereof have been exemplarily described above, the description is not limiting. The present application can be implemented in other specific forms without departing from the spirit or the basic feature of the present application. The content shown in the accompanying drawings is merely one of the implementations of the present application, and the actual structure is not limited thereto. Any reference signs in the claims should not be construed as limiting the claims. Therefore, under the teaching of the present application, any structures and embodiments similar to the technical solution that are made by those skilled in the art without creative efforts and without departing from the spirit of the present application shall all fall within the protection scope of the present application. In addition, the word "include" does not exclude other elements or steps, and the word "a/an" before the element is not excluded from including "a plurality of" the elements. A plurality of elements described in the product claims may also be implemented by an element by software or hardware. The words such as first, second, and the like are used to denote names and do not denote any particular order.

What is claimed is:

1. A method for switched display of a grayscale of a multi-line scan light-emitting diode (LED), comprising the following steps:
   step 1: obtaining a grayscale level L and grayscale data K of an LED;
   step 2: setting a compensation level, and adding a compensation value to the grayscale data K according to the compensation level, to obtain grayscale data K';
   step 3: dividing the compensated grayscale data K' into most significant bit data $K_{MSB}$ and least significant bit data $K_{LSB}$ according to a refresh factor of the LED;
   step 4: setting a combination level Q, and determining whether the combination level Q is 0 or whether $2^Q$ is not greater than most significant bit data $K_{MSB}$, and if yes, performing scrambled display of the grayscale data K', otherwise performing combined display of the grayscale data K'; and
   step 5: repeating step 1 to step 4 R*C times according to a line quantity R and a channel quantity C of display of an LED constant-current driver chip, to form a complete display output.

2. The method for switched display of a grayscale of a multi-line scan LED according to claim 1, wherein in step 2, if the grayscale data K' exceeds a maximum grayscale value, the grayscale data K' is equal to the maximum grayscale value.

3. The method for switched display of a grayscale of a multi-line scan LED according to claim 1, wherein the dividing the grayscale data K' in step 3 comprises the following steps:
   obtaining the refresh factor and a frame frequency of the LED;
   multiplying the refresh factor by an original refresh rate, to obtain a target refresh rate;
   dividing the target refresh rate by the frame frequency, to obtain a bit width N of the least significant bit data $K_{LSB}$; and
   subtracting the bit width N of the least significant bit data $K_{LSB}$ from the grayscale level, to obtain a bit width M of the most significant bit data $K_{MSB}$.

4. The method for switched display of a grayscale of a multi-line scan LED according to claim 1, wherein the performing scrambled display of the grayscale data K' in step 4 comprises the following steps:
   displaying the most significant bit data $K_{MSB}$ in $2^N$ groups respectively; and
   distributing the remaining least significant bit data $K_{LSB}$ to the $2^N$ groups according to a dichotomy for display.

5. The method for switched display of a grayscale of a multi-line scan LED according to claim 4, wherein the performing combined display of the grayscale data K' in step 4 comprises the following steps:
   dividing the grayscale data K' by $2^N$ to obtain an integer part and a remainder part;
   distributing the integer part to the $2^N$ groups according to a dichotomy for display; and
   distributing the remainder part to a sub-cycle of a first group for display.

6. The method for switched display of a grayscale of a multi-line scan LED according to claim 5, wherein the distributing the remaining least significant bit data $K_{LSB}$ to the $2^N$ groups according to a dichotomy for display comprises the following steps:
   generating an N-bit counter CNT, to record a quantity of groups obtained through division; and
   determining whether CNT[0:N−1] is less than the least significant bit data $K_{LSB}$, wherein if yes, a pulse-width modulation (PWM) pulse with an extra lighting time is displayed in the group, or otherwise a PWM pulse with an extra lighting time is not displayed in the group.

7. The method for switched display of a grayscale of a multi-line scan LED according to claim 6, wherein the distributing the integer part to the $2^N$ groups according to a dichotomy for display comprises the following steps:
   generating the N-bit counter CNT, to record the quantity of groups obtained through division; and
   determining whether CNT[0:N−1] is less than the value of the integer part of the grayscale data K', wherein if yes, a PWM pulse with $2^Q$ units of time is displayed in the group, or otherwise a PWM pulse does not need to be displayed in the group.

8. The method for switched display of a grayscale of a multi-line scan LED according to claim 7, wherein the generating the N-bit counter CNT, to record the quantity of groups obtained through division comprises the following steps:

recording, by the counter CNT, the quantity of groups obtained through division; and interchanging the most and least significant bits of the counter CNT, to generate a new quantity of groups of a dichotomy.

9. A system for switched display of a grayscale of a multi-line scan light-emitting diode (LED), the system being configured to perform the steps of the method according to claim 1.

10. The system for switched display of a grayscale of a multi-line scan LED according to claim 9, comprising:

a shift register, receiving grayscale data inputted from outside, and storing the grayscale data in a static random access memory (SRAM);

the SRAM, receiving and storing the grayscale data, and sending the grayscale data to a data processing module;

the data processing module, receiving the grayscale data, processing the grayscale data, and sending a processed data value to a comparator;

a counter, recording a currently displayed quantity of clock cycles, and sending the quantity of clock cycles to the comparator; and the comparator, receiving and comparing the data value of the data processing module and the quantity of clock cycles in the counter, and outputting a pulse-width modulation (PWM) pulse.

11. The method for switched display of a grayscale of a multi-line scan LED according to claim 3, wherein the performing scrambled display of the grayscale data K' in step 4 comprises the following steps:

displaying the most significant bit data $K_{MSB}$ in $2^N$ groups respectively; and distributing the remaining least significant bit data $K_{LSB}$ to the $2^N$ groups according to a dichotomy for display.

12. The method for switched display of a grayscale of a multi-line scan LED according to claim 11, wherein the performing combined display of the grayscale data K' in step 4 comprises the following steps:

dividing the grayscale data K' by $2^N$ to obtain an integer part and a remainder part;

distributing the integer part to the $2^N$ groups according to a dichotomy for display; and distributing the remainder part to a sub-cycle of a first group for display.

13. The method for switched display of a grayscale of a multi-line scan LED according to claim 12, wherein the distributing the remaining least significant bit data $K_{LSB}$ to the $2^N$ groups according to a dichotomy for display comprises the following steps:

generating an N-bit counter CNT, to record a quantity of groups obtained through division; and determining whether CNT[0:N−1] is less than the least significant bit data $K_{LSB}$, wherein if yes, a pulse-width modulation (PWM) pulse with an extra lighting time is displayed in the group, or otherwise a PWM pulse with an extra lighting time is not displayed in the group.

14. The method for switched display of a grayscale of a multi-line scan LED according to claim 13, wherein the distributing the integer part to the $2^N$ groups according to a dichotomy for display comprises the following steps:

generating the N-bit counter CNT, to record the quantity of groups obtained through division; and determining whether CNT[0:N−1] is less than the value of the integer part of the grayscale data K', wherein if yes, a PWM pulse with $2^Q$ units of time is displayed in the group, or otherwise a PWM pulse does not need to be displayed in the group.

15. The method for switched display of a grayscale of a multi-line scan LED according to claim 14, wherein the generating the N-bit counter CNT, to record the quantity of groups obtained through division comprises the following steps:

recording, by the counter CNT, the quantity of groups obtained through division; and interchanging the most and least significant bits of the counter CNT, to generate a new quantity of groups of a dichotomy.

\* \* \* \* \*